(12) United States Patent
Pisklak et al.

(10) Patent No.: US 8,695,291 B2
(45) Date of Patent: Apr. 15, 2014

(54) THROUGH ROOF CONNECTOR ASSEMBLY FOR A PHOTOVOLTAIC BUILDING SHEATHING ELEMENT

(75) Inventors: Stephen G. Pisklak, Hockessin, DE (US); James Miller, Midland, MI (US); Michael I Lesniak, Kawkawlin, MI (US); Ryan S. Gaston, Midland, MI (US); Timothy C. Plum, Midland, MI (US); Gerald K. Eurich, Merrill, MI (US); Joseph A. Langmaid, Caro, MI (US); James R. Keenihan, Midland, MI (US)

(73) Assignee: Dow Global Technologies LLC, Midland, MI (US)

( * ) Notice: Subject to any disclaimer, the term of this patent is extended or adjusted under 35 U.S.C. 154(b) by 226 days.

(21) Appl. No.: 13/098,712

(22) Filed: May 2, 2011

(65) Prior Publication Data
US 2012/0279150 A1   Nov. 8, 2012

(51) Int. Cl.
*E04D 13/18* (2006.01)
*H01L 31/042* (2006.01)
*H02G 3/22* (2006.01)

(52) U.S. Cl.
CPC .................................... *H02G 3/22* (2013.01)
USPC .................... 52/173.3; 52/220.8; 136/244

(58) Field of Classification Search
USPC .......... 52/173.3, 220.1, 220.8; 126/623, 704; 136/244, 251, 291
See application file for complete search history.

(56) References Cited

U.S. PATENT DOCUMENTS

| | | | | |
|---|---|---|---|---|
| 5,546,804 A | * | 8/1996 | Johnson et al. | 73/431 |
| 6,967,278 B2 | * | 11/2005 | Hatsukaiwa et al. | 136/251 |
| 2001/0034982 A1 | * | 11/2001 | Nagao et al. | 52/173.3 |
| 2002/0043031 A1 | * | 4/2002 | Eguchi et al. | 52/173.3 |
| 2005/0091833 A1 | * | 5/2005 | Kiepen et al. | 29/594 |

FOREIGN PATENT DOCUMENTS

| | | | |
|---|---|---|---|
| WO | 2009/137347 | A3 | 11/2009 |
| WO | 2009/137348 | A3 | 11/2009 |
| WO | 2009/137352 | A3 | 11/2009 |
| WO | 2009/137353 | A3 | 11/2009 |

* cited by examiner

*Primary Examiner* — William Gilbert
(74) *Attorney, Agent, or Firm* — The Dobrusin Law Firm, PC

(57) ABSTRACT

The present invention is premised upon a through-roof connector assembly comprising one or more photovoltaic building sheathing elements capable of being affixed on a building structure, the photovoltaic building sheathing element including a sheathing element electrical connector along a sheathing element peripheral edge; a through-roof connector edge piece assembly that abuts a portion of the photovoltaic building sheathing element and includes: a body portion, an edge piece electrical connector, one or more wire leads that are connected on one end to the edge piece electrical connector; a wire guiding member with at least one conduit hole, the wire guiding member located under the through-roof connector edge piece assembly when assembled; and an under-roof junction device that is removably connected to the wire guiding member.

13 Claims, 6 Drawing Sheets

THROUGH ROOF CONNECTOR ASSEMBLY FOR A PHOTOVOLTAIC BUILDING SHEATHING ELEMENT

FIELD OF THE INVENTION

The present invention relates to a through roof connector assembly for use with a photovoltaic roofing or building sheathing element that is capable of being affixed on a building structure. The connector assembly including at least: an edge piece, a wire guiding conduit, and an under-roof connector device.

BACKGROUND

Efforts to improve PV devices, particularly those devices that are integrated into building structures (e.g. photovoltaic sheathing elements, spacer pieces, edge pieces), to be used successfully, should satisfy a number of criteria. The PV device and the array as installed should be durable (e.g. long lasting, sealed against moisture and other environmental conditions) and protected from mechanical abuse over the desired lifetime of the product, preferably at least 10 years, more preferably at least 25 years. The device should be easily installed into the array of devices (e.g. installation similar to conventional roofing shingles or exterior wall coverings) or replaced (e.g. if damaged). It is desirable that it be designed to prevent, as much as possible, water from getting under the device and to the building surface that the device is affixed to. It may also be preferable that the array of devices be visually pleasing, for example be flush (or substantiality flush) with any surrounding sheathing material such as asphalt shingles or tiles.

To make this full package desirable to the consumer, and to gain wide acceptance in the marketplace, the system should be inexpensive to build and install. This may help facilitate lower generated cost of energy, making PV technology more competitive relative to other means of generating electricity.

Existing art systems for PV devices may allow for the device to be directly mounted to the building structure or they may fasten the devices to battens, channels or "rails" ("stand-offs")) above the building exterior (e.g. roof deck or exterior cladding). These systems may be complicated, typically do not install like conventional cladding materials (e.g. roofing shingles or siding) and, as a consequence, may be expensive to install. Also, they may not be visually appealing as they do not look like conventional building materials. "Stand-offs" to mount PV device every 2-4 feet may be required. Thus, installation cost can be as much or more as the cost of the article. They also may suffer from issues related to environmental conditions such as warping, fading and degradation of its physical properties.

Among the literature that can pertain to this technology include the following patent documents: WO/2009/137353A3; WO/2009/137352A3; WO/2009/137348A3; and WO/2009/137347A3; all incorporated herein by reference for all purposes and particularly for teachings on photovoltaic roofing or building sheathing element, arrays, and connectors.

SUMMARY OF THE INVENTION

The present invention is directed to through-roof connector assembly for use with a photovoltaic roofing or building sheathing element that is capable of being affixed on a building structure. More particularly to an improved assembly that allows the electrical from the photovoltaic sheathing element (or array of elements) to be transferred into the building structure while solving one or more of the problems discussed above. It is contemplated that the assembly include at least an edge piece with an electrical connector and wires, a wire guiding member that is disposed under the edge piece and a junction device connected to the wire guiding member located inside the building structure. Each of these components may include further features that may aid in performing the desired task of solving one or more of the problems discussed above and are discussed in further detail within this application.

DETAILED DESCRIPTION OF THE PREFERRED EMBODIMENT

Figure 1:
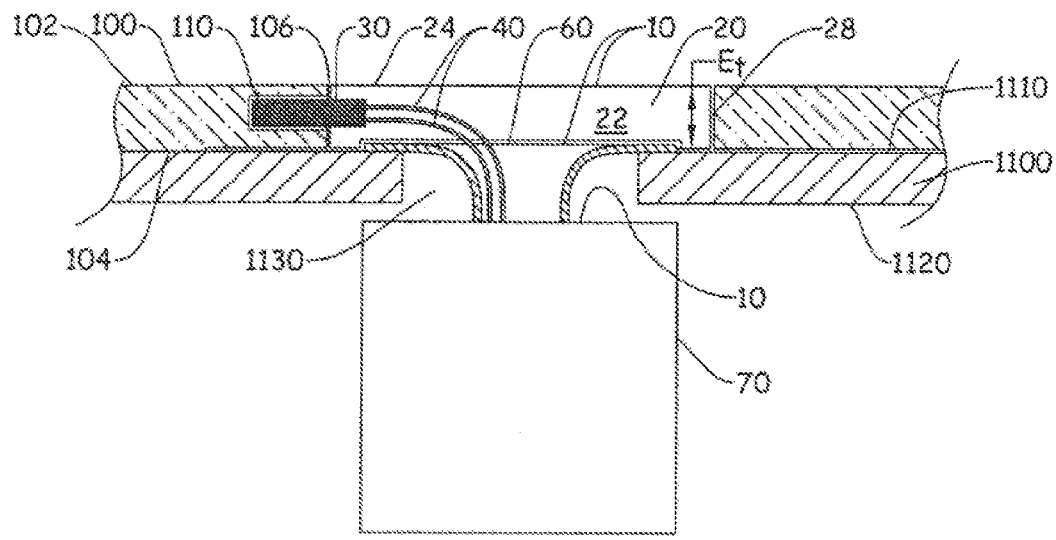
FIG. 1 is an exemplary side view according to the present invention.
Figure 2:
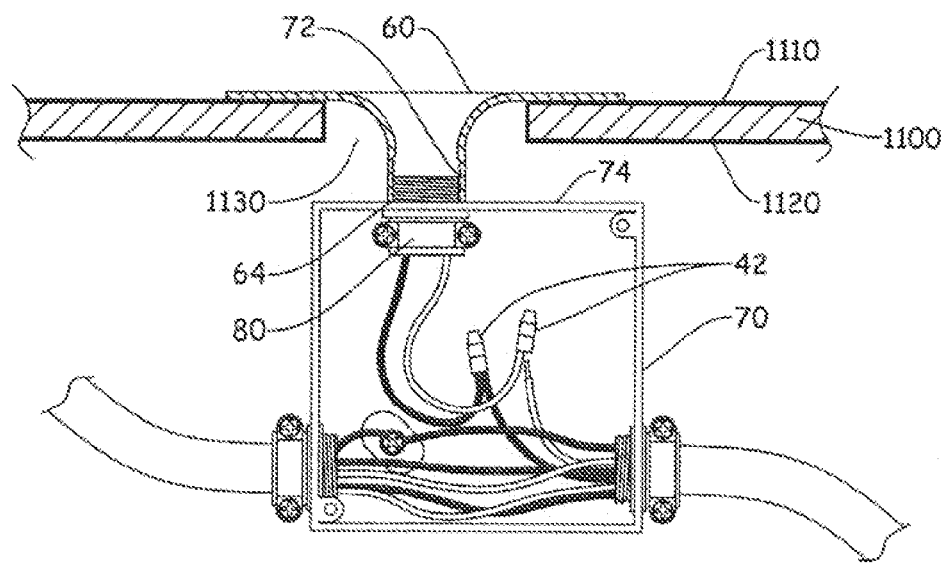
FIG. 2 is a partial exemplary side view according to the present invention

The present invention relates to through-roof connector assembly 10 for use with a photovoltaic roofing or building sheathing element 100 (or array of elements 1000) that is capable of being affixed on a building structure 1100, as partially illustrated in FIGS. 1 and 2, can be described generally as an assembly of a number of components that functions to provide a conduit (for the electrical energy) from the outer surface 1110 of the building structure 1100 to the interior 1120 thereof (via through-hole 1130). It is contemplated that the through-roof connector assembly 10 may consist of a number of components including, but not limited to: a through-roof connector edge piece assembly 20; an edge piece electrical connector 30; two or more wire leads 40 that are connected on one end to the edge piece electrical connector 30; one or more wire securing members 50 (see FIG. 3) capable of securing the one or more wire leads to the edge piece; a wire guiding member 60 with at least one conduit hole 62, an under-roof junction device 70 that is removably connected to the wire guiding member, and a under-roof wire securing member 80. Each of the components and component assemblies and their relationships are disclosed in greater detail and specificity in the following paragraphs.

Accordingly, pursuant to one aspect of the present invention, there is contemplated a through-roof connector assembly comprising: one or more photovoltaic building sheathing elements capable of being affixed on a building structure, the photovoltaic building sheathing element including a sheathing element electrical connector along a sheathing element peripheral edge; a through-roof connector edge piece assembly that abuts a portion of the photovoltaic building sheathing element and includes: a body portion with a top surface, a bottom surface and a side surface, an edge piece electrical connector in electrical communication with the sheathing element electrical connector when assembled, one or more wire leads that are connected on one end to the edge piece electrical connector; a wire guiding member with at least one conduit hole, the wire guiding member disposed under the through-roof connector edge piece assembly when assembled; an under-roof junction device that is removably connected to the wire guiding member.

The invention may be further characterized by one or any combination of the features described herein, such as the one or more wire leads include push-on electrical connectors on an end opposite the end connected to the edge piece electrical connector; the two or more wire leads include an adhesive lined tube disposed over a portion of the wire lead that is in contact with the under-roof wire securing member; the wire guiding member includes a threaded portion on an inside surface of the at least one conduit hole; the under-roof junction device includes a threaded portion that is adapted to mate to the threaded portion of the wire guiding member; the wire guiding member includes a shoulder surface capable of abutting the under-roof junction device when assembled; the under-roof junction device comprises a conduit; the under-roof junction device comprises a junction box; as installed on the building structure, the top surface of the body portion is within 10 mm of a flush condition with a top surface of the abutted one or more photovoltaic building sheathing elements; one or more wire restraining members capable of restraining the one or more wire leads; a under-roof wire securing member disposed on the wire guiding member, the under-roof junction device, or both.

It should be appreciated that the above referenced aspects and examples are non-limiting, as others exist within the present invention, as shown and described herein.

Photovoltaic Roofing or Building Sheathing Element 100

It is contemplated that the sheathing element 100 may be a PV device, or a spacer element, for example as described and disclosed in PCT publication 2009/137353 and corresponding U.S. patent application Ser. No. 12/989743, incorporated herein by reference for the teachings of the structure of the photovoltaic device and the filler piece (AKA spacer devices "S"). The element 100 can be further defined as having a top surface 102, a bottom surface 104 and a peripheral edge 106 spanning therebetween. It is also contemplated that the element 100 has an electrical connector (e.g. sheathing element electrical connector 110) disposed on or about the peripheral edge 106 that provides the junction for electrical energy produced by the element (or the array). In a preferred embodiment, the peripheral edge is no more than about 35 mm in thickness, more preferably no more than about 25 mm, most preferably about 20 mm, and no thinner that about 5 mm, more preferably no thinner than about 10 mm, and most preferably no thinner than about 15 mm.

Array of Devices/Elements 1000

Figure 5:
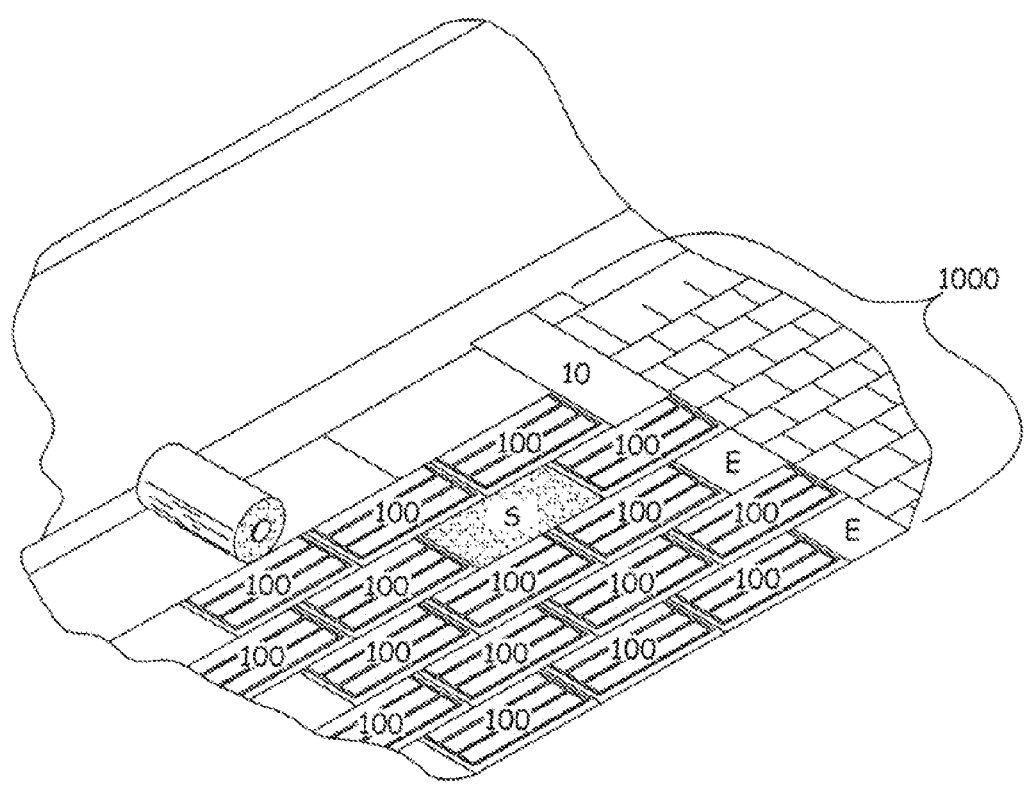
FIG. 5 is an exemplary perspective view of the present invention installed on a building structure.

An array of devices (e.g. PV shingles 100, spacer devices "S", edge pieces "E", through-roof connector assembly 10, etc.) function to provide electrical energy when subjected to solar radiation (e.g. sunlight). An array is a collection of interconnected devices as installed on a building structure 1100. For the purposes of this invention, it is contemplated that the array 1000 is installed directly on an existing roof deck (or exterior surface) of a building structure 1100, over a roofing underlayment material (felt, self-adhered water barrier, fire-retardant layer, or moisture barrier sheet), or over a previously installed roofing material (e.g. asphalt shingles), in the same way traditional roofing shingles are applied (unless otherwise noted herein). An edge piece "E" generally functions to connect multiple rows of devices together, and may or may not include other functional elements. A spacer device "S" generally may function to connect devices within a row, and may or may not include other functional elements. In a preferred embodiment, these arrays 1000 may be made up of two or more rows of adjoining devices, the rows containing at least two or more devices themselves. As an illustrative example, at least partially shown in FIG. 5, the array 1000 presented has 5 rows, with 5 devices per row including an edge piece on each end (or a through-roof connector assembly 10 as shown on the top row). The focus of this invention is how to take the electric energy from the array 1000 and transfer it from the end of the array 1000 and into the building structure 1100 with the use of the through-roof connector assembly 10.

Through-Roof Connector Assembly 10

Figure 4:
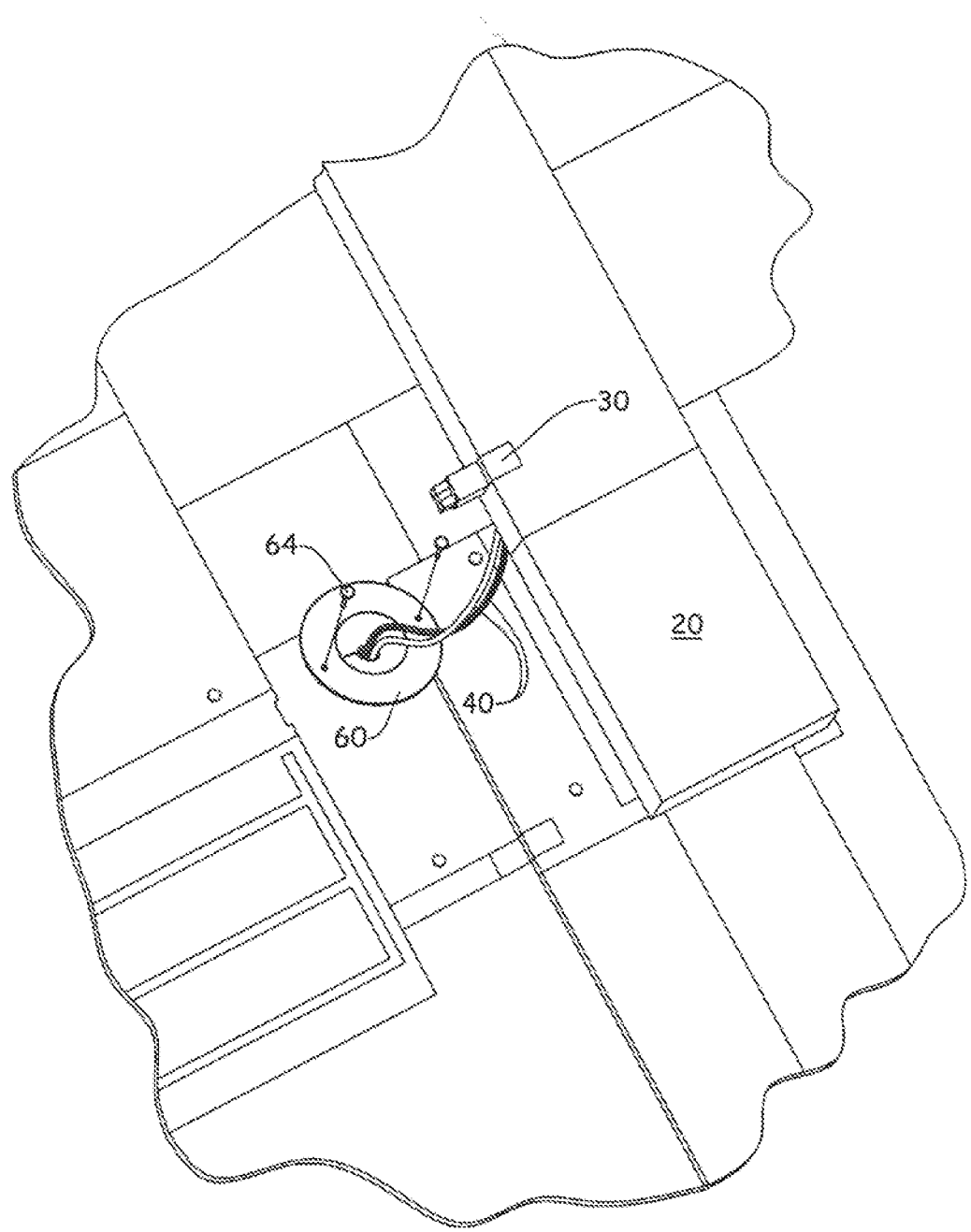
FIG. 4 is a partially perspective exploded view of the present invention as it would be installed on a building structure.

The through-roof connector assembly 10 generally functions as an apparatus that provides an avenue for the electrical energy of a sheathing element (e.g. PV shingle) 100 or array of devices 1000 to be transferred from the outside of a building structure 1100 to the inside thereof. It may be constructed of a number of components, some located outside the building structure and some located within the building structure. An exemplary embodiment is shown in FIG. 4. In this illustration, a partially exploded view of some of the individual components/assemblies can be seen. Proceeding from top to bottom, first a through-roof connector edge piece assembly 20 with a connector 30 and two wire leads 40 is shown, and then next a wire guiding member 60 (with one exemplary fastener 64, for fastening the member 60 to the building structure). Each component/assembly is described in further detail in the following paragraphs.

Through-Roof Connector Edge Piece Assembly 20

The through-roof connector edge piece assembly 20 serves as the outer piece of the through-roof connector assembly 10. It functions to provide a cover for the other components of the assembly 10 as well as a mounting structure for select components. It may be further defined as a three-dimensional object that includes a body portion 22 with a top surface 24, a bottom surface 26, a side surface 28 spanning therebetween, and a thickness $E_T$. It is contemplated that the body portion 22 (and particularly the top surface 24) has to withstand the same environmental conditions as the sheathing elements 100 and may be constructed of the same or similar materials. In a preferred embodiment, the body portion may comprise a polymeric material. Preferred materials or combinations of materials include a filled or unfilled moldable plastic (e.g. polyolefins, acrylonitrile butadiene styrene, hydrogenated styrene butadiene rubbers, polyester amides, polysulfone, acetel, acrylic, polyvinyl chloride, nylon, polyethylene terephthalate, polycarbonate, thermoplastic and thermoset polyurethanes, synthetic and natural rubbers, epoxies, styrene-acrylonitrile ("SAN"), polymethyl methacrylate, polystyrene, or any combination thereof). Fillers can include one or more of the following: colorants, fire retardant ("FR") or ignition resistant ("IR") materials, reinforcing materials, such as glass or mineral fibers, mineral fillers, such as talc, calcium carbonate or mica, or surface modifiers. Plastic can also include anti-oxidants, release agents, blowing agents, and other common plastic additives.

Figure 3:
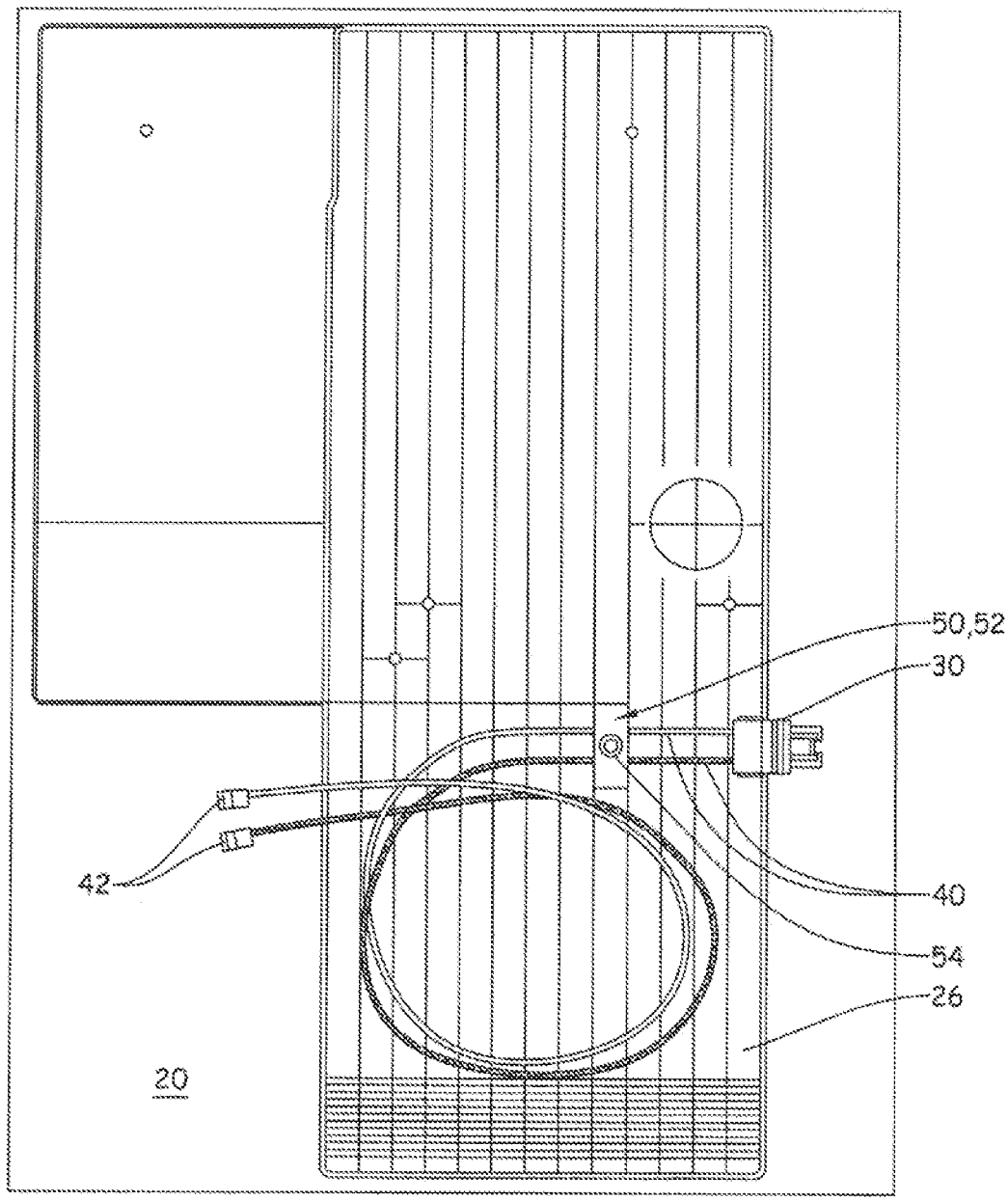
FIG. 3 is a bottom plan view of an exemplary through-roof connector edge piece assembly according to the present invention.

The bottom surface 26, when assembled to the building, may be adapted to sit on the building structure, a lower device 100, a side piece E, the member 60, or all of the above. In one embodiment, the bottom surface includes features to aid in the packaging of the member 60 (e.g. similar to the depression shown in FIG. 1 vis-à-vis the member 60) and includes one or more wire securing members 50, for example as shown in FIG. 3. It is contemplated that the bottom surface 26 may also include ribs or other geometric features that add structure and/or reduce mass.

In a preferred embodiment, the side surface 28 is adapted to mate or match the corresponding side surface of the sheathing element 100 when assembled to the building. It is also contemplated, that the thickness $E_T$ be such that the top surface 24 of the body portion 22 is within about 20 mm of a flush condition (plus or minus) with a top surface of the abutted sheathing element 100 when assembled. It is more preferred that the two adjoining surfaces be completely flush with one another.

The through-roof connector edge piece assembly 20 also may include an edge piece electrical connector 30 that functions to electrically connect the element 100 to the assembly 20. It is contemplated that this connector 30 may be single piece connector assembly or a multi-piece connector/bridging connector assembly (as disclosed in WO 2012/154,307 and incorporated by reference for the purpose of teaching connectors). In a preferred embodiment, the edge piece electrical connector 30 is at least partially integral to the side surface 28 (e.g. snapped or over molded into the side surface 28) and is no thicker that the side surface 28.

Figure 6:
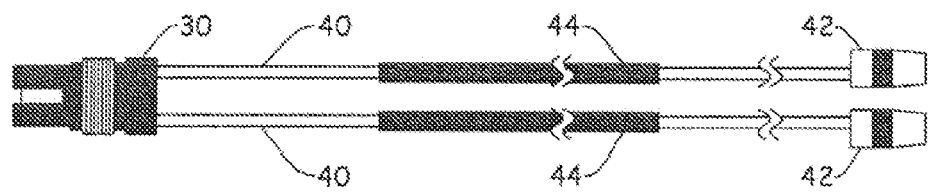
FIG. 6 is a plan view of exemplary wire lead assembly according to the present invention.

It is contemplated that the connector 30 also includes at least one or more wire leads 40, as shown in FIGS. 3 and 6 with two wire leads. These wire leads 40 function to conduct electricity from the connector 30 to the under-roof junction device 70. It is contemplated that the wire leads 40 are constructed of any number of materials that are suitable to perform the function, but are preferred to be constructed of a coated metallic wire. It is preferred that the wire leads 40 also include push-on electrical connectors 42 on one end, as shown in FIGS. 3 and 6, although other types of connection device known in the art .are contemplated, and are commonly known as "touch-safe connectors". These connectors 42 preferably are configured such that anyone handling them does not receive an inadvertent shock.

In one preferred embodiment, the wire leads 40 may include an additional coating member 44 (e.g. an adhesive lined tube), at least locally, as shown in FIG. 6. In this preferred embodiment, the coating member 44 is disposed at least in the area where the wire leads 40 are engaged by an under-roof wire securing member 80.

The through-roof connector edge piece assembly 20 also may include one or more wire securing members 50 that function to provide strain relief for the wire leads 40, for example as shown in FIG. 3. This may be provided in any number of ways, so long as the wire leads 40 are held in place so that it is not likely that wire loads and strains will not be transferred to the connector or the wires will not become disengaged from the connector 30, nor be damaged by the member 50 itself. In an illustrative example, as shown in FIG. 6, the wire leads 40 run between a plate 52 and the bottom surface 26 of the assembly 20, and the plate 52 is secured via a fastener 54.

Wire guiding Member 60

Figure 7A:
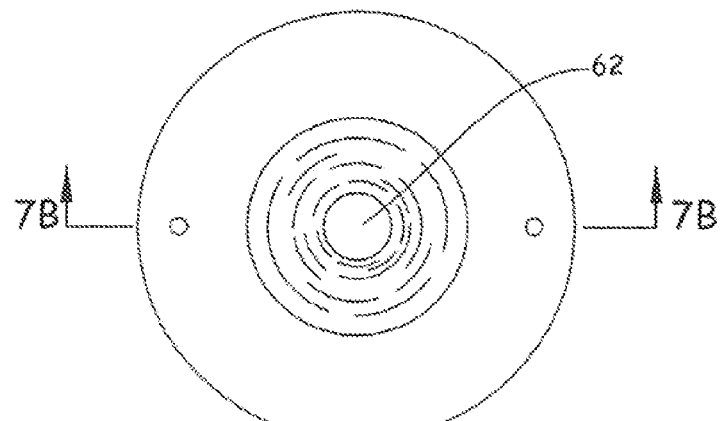
FIGS. 7A-B are plan and side views of an exemplary wire guiding member according to the present invention.
Figure 7B:
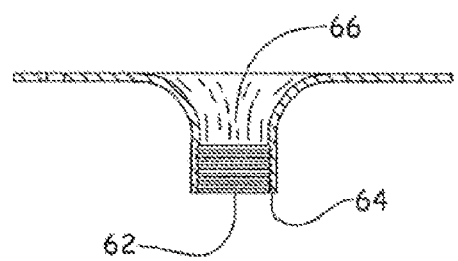

The through-roof connector assembly 10 may also include a wire guiding member 60. The wire guiding member 60 functions to provide at least a pathway for the wire leads 40 to traverse between outside and inside of the building structure (via a through-hole in the building). It is contemplated that the wire guiding 60 may be adapted such that it has a radius $R_F$ designed to prevent a wire minimum bend radius from being exceeded, for example as shown in FIG. 7. It is also contemplated that the wire guiding member may serve to prevent abrading or cutting of the wire insulation at the interface of dissimilar materials, such as the sheathing elements, underlayments, or roof structure itself during installation or any time during its life. The member 60 may also include at least one conduit hole 62 and shoulder 64. It may also include a threaded portion 66, that may be on the inside of the member 60 (e.g. as shown in FIG. 7), that may be on the outside of the member 60 (not shown), or both. The threaded portion 66 functions to provide a connection mechanism between the wire guiding member 60 and the under-roof junction device 70 and/or the under-roof wire securing member 80. In a preferred embodiment, as shown in FIG. 2, the wire guiding member 60 has a threaded portion 66 on the inside that mates to a threaded portion 72 of the under-roof junction device 70 and where the shoulder 64 mates to the outer surface 74 of the device 70. In this configuration, it is contemplated that the device 70 need not be directly secured to the building structure 1100, but is held in-place via the assembly 10 as a whole.

It is also contemplated that the member 60 include a separate insert piece (not shown) that functions to aid in keeping a wire minimum bend radius from being exceeded.

It is contemplated that the wire guiding member may be constructed of any number of materials, both metallic and polymeric. Preferred materials include zinc-plated steel, stainless steel, aluminum, or a filled or unfilled moldable plastic (e.g. polyolefins, acrylonitrile butadiene styrene, hydrogenated styrene butadiene rubbers, polyester amides, polysulfone, acetel, acrylic, polyvinyl chloride, nylon, polyethylene terephthalate, polycarbonate, thermoplastic and thermoset polyurethanes, synthetic and natural rubbers, epoxies, styrene-acrylonitrile ("SAN"), polymethyl methacrylate, polystyrene, or any combination thereof).

Under-Roof Junction Device

The through-roof connector assembly 10 may also include an under-roof junction device 70. This device 70 functions to provide a place to connect the wire leads 40 to the wiring or other circuitry inside the building structure 1100 (preferably via push-on electrical connectors 42), for example as shown in FIG. 2. It is contemplated that this device 70 may be a typical electrical junction box that is typically used in industry. It may also be a conduit that provides a path for the wire leads 40 to be routed somewhere else inside the building 1100.

In one preferred embodiment, it may be desirable that an under-roof wire securing member 80 be utilized in a location at or near the interface between the wire guiding member 60 and the device 70. It is contemplated that the under-roof wire securing member 80 may be a standard component as shown in FIG. 2 or may be integral to the wire guiding member 60.

It is contemplated that the under-roof junction device may be constructed of any number of materials, both metallic and polymeric. Preferred materials include zinc-plated steel, stainless steel, aluminum, or a filled or unfilled moldable plastic (e.g. polyolefins, acrylonitrile butadiene , styrene, hydrogenated styrene butadiene rubbers, polyester amides, polysulfone, acetel; acrylic, polyvinyl chloride, nylon, polyethylene terephthalate, polycarbonate, thermoplastic and thermoset polyurethanes, synthetic and natural rubbers, epoxies, styrene-acrylonitrile ("SAN"), polymethyl methacrylate, polystyrene, or any combination thereof).

Figure 8:
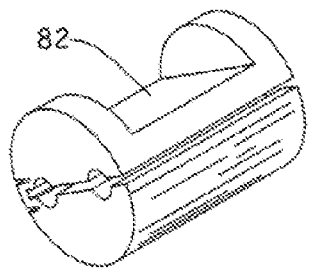
FIG. 8 is a perspective view of an exemplary sealing element according to the present invention.

In an alternative embodiment, used in conjunction with the under-roof wire securing member 80 or the wire guiding member 60, a sealing element 82 may be used. It is contemplated that this element 82 may function to aid in ingress prevention of fluids (e.g. water) from the external environment to the under-roof junction device 70. It is contemplated that this element 82 may be in the form of a sealant (e.g. caulk or similar potting material) or may be in the form of a component (e.g. as shown in FIG. 8). The illustrative example of the element 82, shown in FIG. 8, is a bushing that generally fits inside of the under-roof wire securing member 80 and clamps down on the wire leads 40 when member is tightened.

Figure 9:
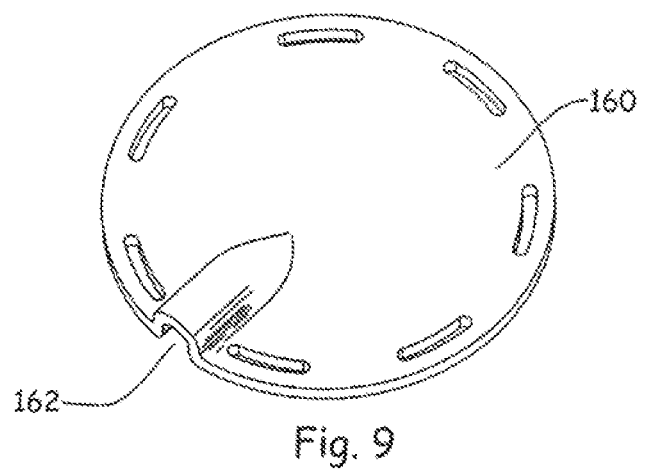
FIGS. 9 and 10 are perspective views of exemplary two styles of capping members according to the present invention.
Figure 10:
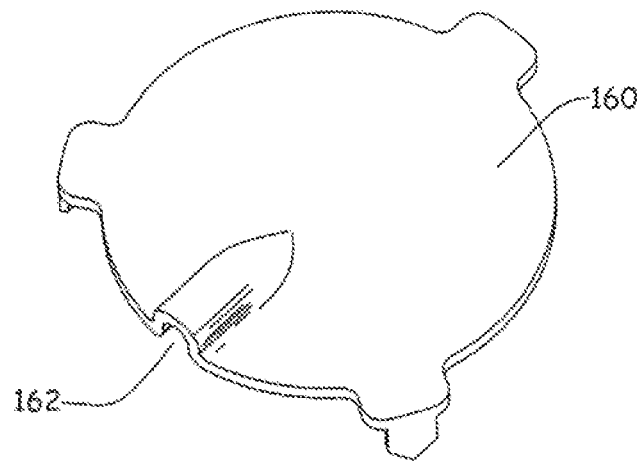

In yet another alternative embodiment, a capping member 160, for example as shown in FIGS. 9 and 10, may function to aid in ingress prevention of fluids (e.g. water) from the external environment to the under-roof junction device 70. In this embodiment, the member 160 may also include a wire conduit 162 to aid in directing the wire lead(s) 40 under the capping member 160.

It is contemplated that the embodiments or examples described above may not be mutually exclusive and may be used in combination with each other.

Unless stated otherwise, dimensions and geometries of the various structures depicted herein are not intended to be restrictive of the invention, and other dimensions or geometries are possible. Plural structural components can be provided by a single integrated structure. Alternatively, a single integrated structure might be divided into separate plural components. In addition, while a feature of the present invention may have been described in the context of only one of the illustrated embodiments, such feature may be combined with one or more other features of other embodiments, for any given application. It will also be appreciated from the above that the fabrication of the unique structures herein and the operation thereof also constitute methods in accordance with the present invention.

The preferred embodiment of the present invention has been disclosed. A person of ordinary skill in the art would realize however, that certain modifications would come within the teachings of this invention. Therefore, the following claims should be studied to determine the true scope and content of the invention.

Any numerical values recited in the above application include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes.

The term "consisting essentially of" to describe a combination shall include the elements, ingredients, components or steps identified, and such other elements ingredients, components or steps that do not materially affect the basic and novel characteristics of the combination.

The use of the terms "comprising" or "including" describing combinations of elements, ingredients, components or steps herein also contemplates embodiments that consist essentially of the elements, ingredients, components or steps.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps. All references herein to elements or metals belonging to a certain Group refer to the Periodic Table of the Elements published and copyrighted by CRC Press, Inc., 1989. Any reference to the Group or Groups shall be to the Group or Groups as reflected in this Periodic Table of the Elements using the IUPAC system for numbering groups.

What is claimed is:

1. A through-roof connector assembly comprising:
   one or more photovoltaic building sheathing elements, the photovoltaic building sheathing element including a sheathing element electrical connector along a sheathing element peripheral edge;
   a through-roof connector edge piece assembly that abuts a portion of the photovoltaic building sheathing element: wherein the sheathing elements and the edge piece assembly when installed are installed directly on a roof deck of a building structure over roofing underlayment material or previously installed roofing material disposed on the roof deck:
   and wherein the through-roof connector edge piece assembly includes:
      a body portion with a top surface, a bottom surface and a side surface,
      an edge piece electrical connector in electrical communication with the sheathing element electrical connector when assembled,
      one or more wire leads that are connected on one end to the edge piece electrical connector;
   a wire guiding member with at least one conduit hole, the wire guiding member disposed under the through-roof connector edge piece assembly when assembled wherein the portion of the wire guiding member that forms the at least one conduit hole passes through a hole in the roofing deck to the inside of the building;
   an under-roof junction device when assembled is located below the roof deck inside the building and is removably connected to the wire guiding member such that the under roof junction device is held in place by the removable connection.

2. The through-roof connector assembly according to claim 1, further comprising a under-roof wire securing member disposed on the wire guiding member, the under-roof junction device, or both.

3. The through-roof connector assembly according to claim 2, wherein the two or more wire leads include an adhesive lined tube disposed over a portion of the wire lead that is in contact with the under-roof wire securing member.

4. The through-roof connector assembly according to claim 1, further comprising one or more wire restraining members capable of restraining the one or more wire leads.

5. The through-roof connector assembly according to claim 1, wherein the one or more wire leads include push-on electrical connectors on an end opposite the end connected to the edge piece electrical connector.

6. The through-roof connector assembly according to claim 1, wherein the wire guiding member includes a threaded portion on an inside surface of the at least one conduit hole.

7. The through-roof connector assembly according to claim 6, wherein the under-roof junction device includes a threaded portion that is adapted to mate to the threaded portion of the wire guiding member.

8. The through-roof connector assembly according to claim 1, wherein the wire guiding member includes a shoulder surface capable of abutting the under-roof junction device when assembled.

9. The through-roof connector assembly according to claim 1, wherein the under-roof junction device comprises a conduit.

10. The through-roof connector assembly according to claim 1, wherein the under-roof junction device comprises a junction box.

11. The through-roof connector assembly according to claim 1, wherein as installed on the building structure, the top surface of the body portion is within 10 mm of a flush condition with a top surface of the abutted one or more photovoltaic building sheathing elements.

12. The through-roof connector assembly according to claim 1, wherein the through hole formed by the wire guiding member has a radius such that a wire minimum bend radius is not exceeded.

13. The through-roof connector assembly according to dam 1, which further comprises a capping member adapted to be installed over the wire guiding member having a wire conduit to direct wire leads under the capping member to the wire guiding member.

* * * * *

UNITED STATES PATENT AND TRADEMARK OFFICE
CERTIFICATE OF CORRECTION

PATENT NO.       : 8,695,291 B2
APPLICATION NO.  : 13/098712
DATED            : April 15, 2014
INVENTOR(S)      : Pisklak et al.

Page 1 of 1

It is certified that error appears in the above-identified patent and that said Letters Patent is hereby corrected as shown below:

In the Claims

Col. 8, Line 26, Claim 1, delete "sheathing element:" and insert --sheathing element;--

Col. 8, Line 31, Claim 1, delete "roof deck:" and insert --roof deck;--

Col. 9, Line 29, Claim 13, delete "dam 1" and insert --claim 1--

Signed and Sealed this
Fifteenth Day of July, 2014

Michelle K. Lee
*Deputy Director of the United States Patent and Trademark Office*